US011264651B2

(12) United States Patent
Zarabadi et al.

(10) Patent No.: US 11,264,651 B2
(45) Date of Patent: Mar. 1, 2022

(54) METHOD TO DETECT CURRENT LEAKAGE FROM A VEHICLE BATTERY

(71) Applicant: DELPHI TECHNOLOGIES IP LIMITED, St. Michael (BB)

(72) Inventors: Seyed R. Zarabadi, Kokomo, IN (US); Mark W. Gose, Kokomo, IN (US)

(73) Assignee: DELPHI TECHNOLOGIES IP LIMITED, St. Michael (BB)

( * ) Notice: Subject to any disclaimer, the term of this patent is extended or adjusted under 35 U.S.C. 154(b) by 120 days.

(21) Appl. No.: 16/804,604

(22) Filed: Feb. 28, 2020

(65) Prior Publication Data

US 2021/0273269 A1    Sep. 2, 2021

(51) Int. Cl.
*G01R 31/00* (2006.01)
*H01M 10/42* (2006.01)
*G01R 31/396* (2019.01)
*G01R 31/392* (2019.01)
*B60L 50/64* (2019.01)
*G01R 31/52* (2020.01)

(52) U.S. Cl.
CPC ......... *H01M 10/4285* (2013.01); *B60L 50/64* (2019.02); *G01R 31/392* (2019.01); *G01R 31/396* (2019.01); *G01R 31/52* (2020.01); *H01M 2220/20* (2013.01)

(58) Field of Classification Search
USPC ................................................ 324/426–435
See application file for complete search history.

(56) References Cited

U.S. PATENT DOCUMENTS

| 5,382,946 | A | 1/1995 | Gale |
| 5,399,445 | A | 3/1995 | Tinker |
| 5,481,194 | A | 1/1996 | Schantz et al. |
| 5,824,883 | A | 10/1998 | Park et al. |
| 7,026,788 | B2 | 4/2006 | Yano et al. |
| 7,629,794 | B2 | 12/2009 | Kamata |
| 2010/0102975 | A1 | 4/2010 | Vossmeyer et al. |
| 2015/0333378 | A1 | 11/2015 | Chang et al. |
| 2016/0214484 | A1* | 7/2016 | Gale ...................... G01R 31/52 |
| 2019/0146040 | A1* | 5/2019 | Murakami ........... G01R 31/389 324/430 |

* cited by examiner

*Primary Examiner* — Vincent Q Nguyen
(74) *Attorney, Agent, or Firm* — Bookoff McAndrews, PLLC

(57) ABSTRACT

An apparatus is configured to determine the leakage resistance in respect of the positive and/or negative terminals of a vehicle battery. The apparatus includes a first pair of serially arranged resistors connected between the terminals with a first switch connected between the resistors and a second pair of serially arranged resistors connected between the vehicle chassis/nominal ground and the negative terminal or the positive terminal, with a second switch connected between the resistors. A further fifth resistor is connected between the vehicle chassis/nominal ground, and the negative terminal or the positive terminal via a third switch, and a controller is configured to selectively control the switches during processing steps.

20 Claims, 3 Drawing Sheets

Prior Art

Fig. 4
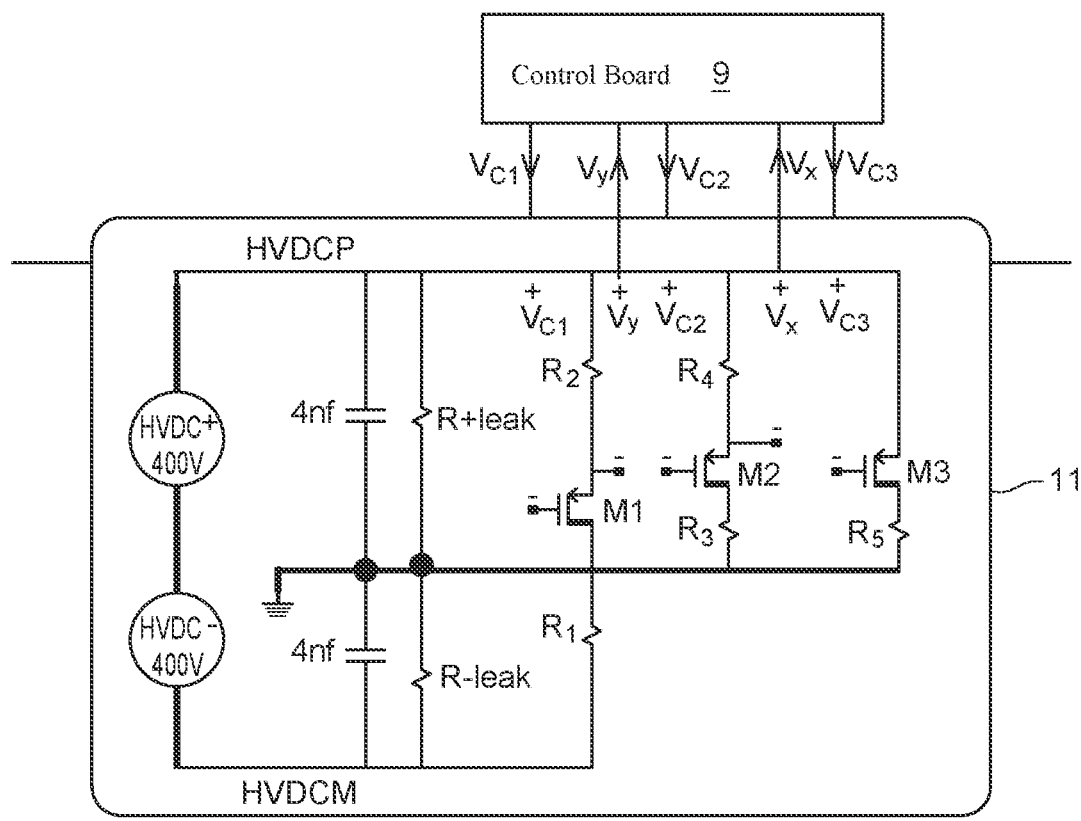
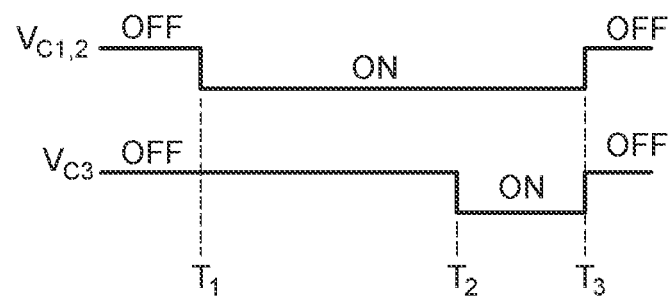
Fig. 5

METHOD TO DETECT CURRENT LEAKAGE FROM A VEHICLE BATTERY

TECHNICAL FIELD

This invention relates to a method of detecting leakage resistances from the vehicle battery pack to the chassis of the vehicle. It has particular application to electrical vehicles (EV) including hybrid electric vehicles (HEV) and plug-in hybrid electric vehicles (PHEV).

BACKGROUND OF THE INVENTION

Isolation between high-voltage battery pack terminals to the chassis of a vehicle is a critical parameter/requirement for the safety of HEV and EV systems. There are several factors that could cause degradation or even loss of isolation in EV and HEV systems; these include ageing/deterioration in the wiring harnesses, a faulted motor winding, and failures of electrical isolators. Any single point for failure of isolation is a potential life risk when operators make contact with this high-voltage operating environment, and therefore there is a need to have a mechanism to detect every single point failure of isolation in a system.

Leakage resistance between a battery pack terminal and an EV/HEV automobile chassis terminal would allow current to flow if someone touched the other battery pack terminal while also contacting chassis, thus becoming a hazard risk. A method of accurately measuring the leakage resistances can be used to indicate to the system that a fault may have occurred in order to take proper decisions/actions to render the system as safe.

The challenge in detecting and accurately measuring the leakage resistance is that the detection and measuring circuits should not themselves introduce a permanent leakage path between the battery terminals and the chassis terminal of the vehicle.

In prior art methods and systems, there is a significant added cost which is incurred in order to avoid any unwanted permanent leakage resistance unavoidably introduced by the detection and measuring leakage resistance circuits.

It is an object of the invention to provide improved methodology and apparatus for leakage resistance determination between the high voltage battery pack terminals and the chassis of the vehicle, and which further does not involve significant cost.

SUMMARY OF THE INVENTION

An apparatus is configured to determine the leakage resistance in respect of a positive terminal and/or a negative terminal of a vehicle battery or battery pack. The apparatus includes a first pair of serially arranged resistors connected between the terminals with a first switch connected between the first pair of serially arranged resistors, comprising a first resistor having one terminal thereof electrically connected to the positive or negative terminal, and the other terminal thereof connected to one terminal of the first switch, and where the second resistor has one terminal connected to the other terminal of the first switch, and the other terminal connected to the negative terminal if the one terminal of the first resistor is connected to the positive terminal or is connected to the positive terminal if the one terminal of the first resistor is connected to the negative terminal, and further including means to measure the voltage ($V_y$) at a point between the first and second resistors; a second pair of serially arranged resistors connected between the vehicle chassis/nominal ground and the negative terminal if the one terminal of the first resistor is connected to the positive terminal or is connected to the positive terminal if the one terminal of the first resistor is connected to the negative terminal, with a second switch connected between the second pair of serially arranged resistors, comprising a third resistor having one terminal electrically connected to the vehicle chassis/nominal ground, and the other terminal connected to one terminal of the second switch, and a fourth resistor having one terminal connected to the other terminal of the second switch and the other terminal connected to the negative terminal if the one terminal of the first resistor is connected to the positive terminal or is connected to the positive terminal if the one terminal of the first resistor is connected to the negative terminal; and further including means to measure the voltage $V_x$ at a point between the third and fourth resistors; a further fifth resistor connected, via a third switch, between the vehicle chassis/nominal ground, and the negative terminal if the one terminal of the first resistor is connected to the positive terminal or is connected to the positive terminal if the one terminal of the first resistor is connected to the negative terminal; and control means configured to selectively control the switches during processing steps; and processing means configured to process the values of $V_y$ and $V_x$ measured during the processing steps, to determine the values of leakage resistance(s). A method of determining the leakage resistance from the positive and/or negative terminals of a vehicle battery or battery pack using the apparatus includes the steps of a) ensuring switch M1 is closed, and measure $V_y$; b) ensuring switch M2 is closed and measure the value of Vx during this step=$V_{x1}$; c) computing $HVDCM_1 = -V_{x1} \cdot (R_3+R_4)/R_4$; d) computing $HVDCP_1 = V_y \cdot (1+R_1/R_2) + HVDCM_1$; e) ensuring switch M3 is closed and measure the value of Vx during this step=, $V_{x2}$; f) computing $HVDCM_2 = -V_{x2} \cdot (R_3+R_4)/R_4$; g) computing $HVDCP_2 = V_y \cdot (1+R_1/R_2) + HVDCM_2$; h) computing the values of $R^+_{leak}$ and/or $R^-_{leak}$ from one or both of the following equations:

$$R^-_{leak} = \beta \cdot R_5 \cdot (\alpha - 1)$$

$$R^+_{leak} = 1 / \{1/[R_5 \cdot (\alpha - 1)] - 1/(R_3 + R_4)\}$$

where, $\alpha = HVDCM_1 \cdot HVDCP_2 / (HVDCM_2 \cdot HVDCP_1)$ and $\beta = HVDCP_1 / HVDCM_1$.

BRIEF DESCRIPTION OF DRAWINGS

The present invention is now described by way of example with reference to the accompanying drawings in which:

FIG. 4 shows an alternative of the invention; and

FIG. 5 shows the state of the switches of the FIG. 4 arrangement and in terms of the voltage applied to the switches with time during the methodology.

DESCRIPTION OF THE PREFERRED EMBODIMENTS

Figure 1:
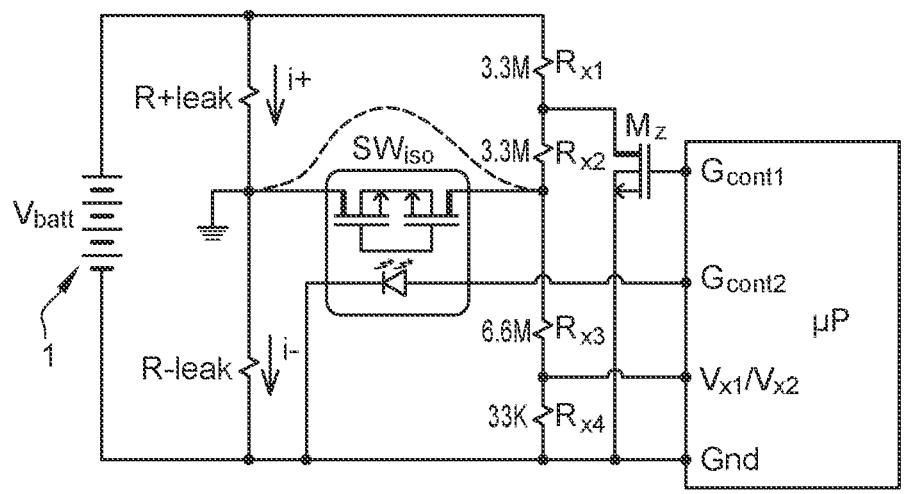
FIG. 1 shows a schematic figure of a prior art arrangement for leak resistance determination.

FIG. 1 shows a schematic of a prior art arrangement for leakage resistance determination with regard to leakage from a vehicle battery/battery pack to chassis ground. The figure shows a vehicle battery/battery pack 1. For a properly isolated system, there would be extremely high resistance from the battery pack 1 terminals to chassis. However, in real systems there may be leakage currents flowing from the positive and negative terminals, i+ and i− respectively, that flow to the chassis. The leakage flow paths can be represented as leakage resistances $R^+_{leak}$ and $R^-_{leak}$, as shown.

The apparatus/arrangement which is used to determine this leakage includes connections to the positive and negative battery terminals along with a connection to the vehicle chassis.

This arrangement uses four ratio-ed external resistors of $R_{x1}$-$R_{x4}$, an external high-voltage FET, switch $M_z$, and isolated switch device $SW_{iso}$ which is used to prevent permanent leakage current between battery terminals and the chassis terminal. It should be mentioned that some implementations of this prior art does not use $SW_{iso}$ switch device to avoid the significant cost associated with this device at the expense of permanent unwanted leakage currents which is unacceptable in many systems.

The leakage resistances $R^+_{leak}$ and $R^-_{leak}$ in FIG. 1 are computed by the micro-processor device by measuring $V_{x1}$ (when $M_z$ is off and $SW_{iso}$ is on), $V_{x2}$ (when $M_z$ is on and $SW_{iso}$ is on) and the scaled version of $V_{batt}$ at the $V_x$ input of the micro-processor device (when both $M_z$ and $SW_{iso}$ switches are off).

The following expressions are programmed into the micro-processor to compute the values of $R^+_{leak}$ and $R^-_{leak}$ resistances.

$$R^+_{leak}=2*R_{x1}*(V_{x1}-V_{x2})*V_{batt}/(V_{x1}*V_{x2}+V_{batt}*V_{x2})$$

$$R^-_{leak}=1/\{[((V_{batt}/V_{x2})-1)/R^+_{leak}]-1/(R_{x3}+R_{x4})-1/R_{x1}\}$$

A major disadvantage of this prior art is the need for the costly device of $SW_{iso}$ switch.

Invention

Aspects of the invention provide a method and device (which may be implemented into an integrated circuit) that is capable of accurately determining the leakage resistances between the above-mentioned system terminals, which eliminates the need for the expensive $SW_{iso}$ switch.

Figure 2:
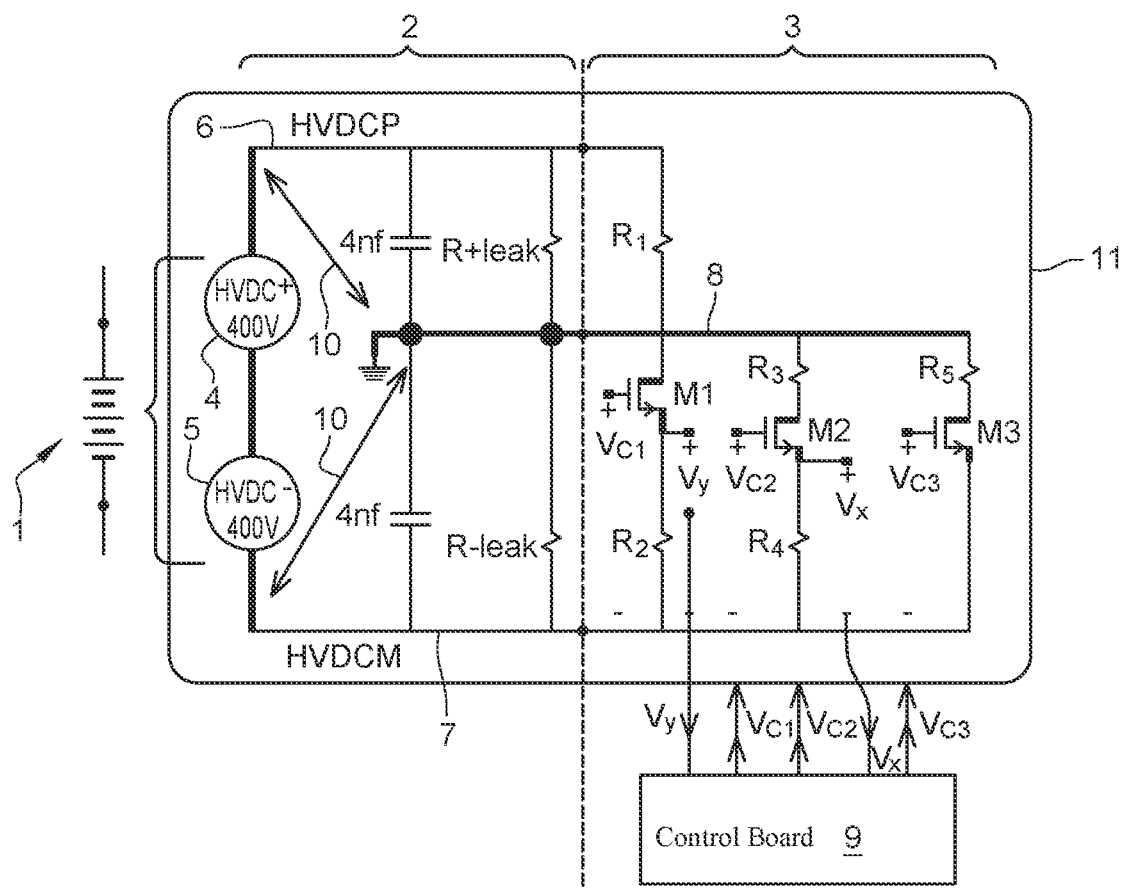
FIG. 2 shows a simplified schematic showing the arrangement of an example the invention.

FIG. 2 show a simplified schematic showing the arrangement of an example of the invention and for which examples of the methodology can be carried out.

The figure can be divided by the dotted line into left hand side portion 2 which generally includes relevant existing vehicle components (terminal) and a right-hand side portion 3 which is of a device or arrangement (circuitry) according to an example of the invention which can also implement the methods.

The portion 2 shows two voltage sources 4 and 5 which connect to the positive and negative terminals of the vehicle battery pack, respectively. Thus, sources 4 and 5 in series can be regarded as equivalent to a battery, which is also shown alternatively (i.e. duplicated) by conventional symbology and reference numeral 1. The lines 6 and 7 represent the potentials of the positive and negative battery terminals respectively designated HVDCP (plus) and HVDCM (minus). Generally, electric vehicles have nominal battery packs voltages that can range from 200V to 800V, depending on the application.

The voltage sources 4 and 5 are connected to power supply lines 6 and 7 respectively, represented by values HVDCP (plus) and HVDCM (minus) respectively. In the figure the dark line 8 represents the chassis voltage (nominally ground) which may be around 0V but not necessarily zero. The effective leakage resistance is shown as $R^+_{leak}$ and $R^-_{leak}$ similar to FIG. 1 which are considered to be connected between HVDCP and chassis, and HVDCM and chassis respectively.

Similar to FIG. 1, the leakage flow paths (represented by arrows 10) can be considered and represented as positive and negative leakage resistances $R^+_{leak}$ and $R^-_{leak}$ as shown.

The right-hand side shows circuitry used in an example by the invention. A series arranged resistor pair (divider) comprising resistors R1 and R2 is provided between lines/terminal 6 and 7 (HVDCP and HVDCM) and included is a controllable switch M1 between these resistors. Switch M1 is controlled by control voltage $V_{C1}$. One terminal of R1 is connected to terminal/line 4/6 (HVDCP) and the other terminal to a terminal of the switch M1. The other terminal of the switch M1 is electrically connected to terminal/line 5/7 (HVDCM) via resistor R2. There is means to measure the voltage Vy at the point between the resistors R1 and R2.

There is a further series arranged resistor (divider) pair comprising resistors R3 and R4 with switch means M2 connected between these resistors. The switch M2 is controlled by control voltage $V_{C2}$. Resistor R3 is connected between the chassis/nominal ground and one terminal of the switch M2, and resistor R4 is connected between the other terminal of the switch and the negative terminal/line 5/7 (HVDCM). There is means to measure the voltage Vx at the point between the resistors R3 and R4.

There is further provided a further resistor R5 connected between the vehicle chassis/nominal ground via switch M3 to the negative terminal/line 5/7 (HVDCM). Switch M3 is controlled by voltage $V_{C3}$. Switches M1, M2, M3 may be for example high voltages FETS, such as MOSFETS Reference numeral 9 shows a general control and measurement block which provides control outputs $V_{C1}$, $V_{C2}$, $V_{C3}$ to the switches M1, M2, and M3 respectively. Control block 9 also has input from a terminal or point located between the resistors R1 and R2 which gives a voltage value Vy, and also has input from a terminal or point located between the resistors R3 and R4 which gives a voltage value Vx.

Control block 9 has means (e.g. including ADC) to measure and process the voltage values Vy and Vx. The block also has processing means so as to process Vy and Vx at different stages in the methodology to determine the value of $R^+_{leak}$ and $R^-_{leak}$.

All or part of the circuitry in portion 3 including M1, M2 and M3, along with processor 9 can be embodied into an integrated circuit. The circuitry 2 denotes the circuitry outside of this embodiment.

By referring to the circuitry (apparatus) shown in FIG. 2, the method according to this invention can be carried out by the following steps, which accurately measures the leakage resistances, $R^+_{leak}$ and $R^-_{leak}$. This method is described in an example as follows:

Step 1

Turn on (i.e. close) high-voltage MOS switches M1 using the $V_{C1}$ control voltage and M2 using the $V_{C2}$ control voltage, measure $V_y$ and $V_x$ using an analog-to-digital converter (ADC), and store the values of this measurement as $V_y$ and $V_{x1}$ respectively.

With the known resistance ratio $R_1/R_2$ and the stored value $V_y$, compute Vbattery_Pack=(HVDCP$_1$−HVDCM$_1$)=$V_y \cdot (1+R_1/R_2)$.

With the known resistance ratio R3/R4 and the stored value $V_{x1}$, compute HVDCM$_1$=−$V_{x1} \cdot (R_3+R_4)/R_4$.

Compute the voltage between the HVDCP and chassis terminals; HVDCP$_1$=VBattery_pack+HVDCM$_1$.

Step 1

Turn on (i.e. close) high-voltage MOS switches M1 using the $V_{C1}$ control voltage and M2 using the $V_{C2}$ control voltage, measure $V_y$ and $V_x$ using an analog-to-digital converter (ADC), and store the values of this measurement as $V_y$ and $V_{x1}$ respectively.

With the known resistance ratio $R_1/R_2$ and the stored value $V_y$, compute Vbattery_Pack=(HVDCP$_1$ −HVDCM$_1$)=$V_y \cdot (1+R_1/R_2)$.

With the known resistance ratio R3/R4 and the stored value $V_{x1}$, compute HVDCP$_1$=$V_{x1} \cdot (R_3+R_4)/R_4$.

Compute the voltage between the HVDCM and chassis terminals; HVDCM$_1$=−VBattery_pack+HVDCP$_1$.

Compute the voltage between the HVDCM and chassis terminals; HVDCM$_1$=−VBattery_pack+HVDCP$_1$ $$HVDCM_1 = -V_y \cdot (1+R_1/R_2) + HVDCP_1.$$

Step 2

Next, with M1 and M2 left on, turn on high voltage MOS switch M3 using control voltage VC3. Measure $V_x$ and store the value of this measurement as $V_{x2}$ With the known resistance ratio R3/R4 and the stored value $V_{x2}$, compute HVDCP$_2$=$V_{x2} \cdot (R_3+R_4)/R_4$.

The voltage between the HVDCM and chassis terminals with M1, M2 and M3 closed can be computed; HVDCM$_2$=−$V_y \cdot (1+R_1/R_2)$+HVDCP$_2$.

Step 3

From results in steps 1 through 2 of Example 2, the values of $R^-_{leak}$ and $R^+_{leak}$ can be computed using a math processing unit of the system, reporting the values of these leakage resistances with high accuracy. They are computed using the following expressions $$R^-_{leak_+} = \beta \cdot R_5 \cdot (\alpha - 1)$$

$$R^+_{leak} = 1/\{1/[R_5 \cdot (\alpha - 1)] - 1/(R_3+R_4)\}$$

Where, $$\alpha = HVDCP_1 \cdot HVDCM_2/(HVDCP_2 \cdot HVDCM_1)$$

And, $$\beta = HVDCM_1/HVDCP_1.$$

After the process, switches M1, M2 and M3 are all off (open) to stop leakage currents.

It should be noted that one or more of the above steps can be divided into sub-steps. Steps and sub-steps comprise switch operation, measurement, and calculation steps. These may be performed in any appropriate order.

FIG. 5 shows the state of the switches of the FIG. 4 arrangement and in terms of the voltage applied to the switches with time during the methodology.

When the process according to examples is not being performed, switches M1, M2, M3 are all open to stop extra leakage current. At the start of the procedure at step 1 at time T1, the voltage to switches M1 and M2 are switched on so the switches are closed. For step 2, at time T2, switch M3 is closed. After the process, at time T3, all switches are commanded off by taking $V_{C1}$, $V_{C2}$ and $V_{C3}$ low.

Again, after the process is complete, switches M1, M2 and M3 are all off (open) to stop leakage current.

We claim:

1. An apparatus configured to determine the leakage resistance in respect of a positive terminal and/or a negative terminal of a vehicle battery or battery pack; said apparatus comprising circuitry comprising:

---

Step 2

Next, with M1 and M2 left on, turn on high voltage MOS switch M3 using control voltage $V_{C3}$. Measure Vx and store the value of this measurement as $V_{x2}$.

With the known resistance ratio R3/R4 and the stored value $V_{x2}$, compute HVDCM$_2$=−$V_{x2} \cdot (R_3+R_4)/R_4$.

The voltage between the HVDCP and chassis terminals with M1, M2 and M3 closed can be computed; HVDCP$_2$=VBattery_pack+HVDCM$_2$=$V_y \cdot (1+R_1/R_2)$+HVDCM$_2$.

Step 3

From results in steps 1 through 2, the values of $R^-_{leak}$ and $R^+_{leak}$ can be computed using a math processing unit of the system, reporting the values of these leakage resistances with high accuracy. They are computed using the following expressions:

$$R^-_{leak} = \beta \cdot R_5 \cdot (\alpha - 1)$$

$$R^+_{leak} = 1/\{1/[R_5 \cdot (\alpha - 1)] - 1/(R_3+R_4)\}$$

Where, $$\alpha = HVDCM_1 \cdot HVDCP_2/(HVDCM_2 \cdot HVDCP_1)$$

And, $$\beta = HVDCP_1/HVDCM_1.$$

After the process, switches M1, M2 and M3 are all off (open) to stop leakage currents.

It should be noted that one or more of the above steps can be divided into sub-steps. Steps and sub-steps comprise switch operation, measurement, and calculation steps. These may be performed in any appropriate order.

Figure 3:
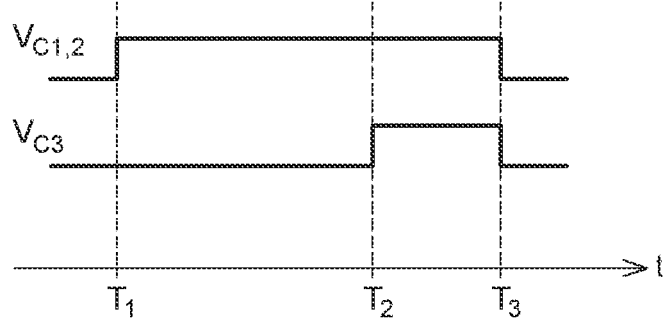
FIG. 3 shows the state of the switches of the FIG. 2 arrangement and in terms of the voltage applied to the switches with time during the methodology.

FIG. 3 shows the state of the switches of the FIG. 2 arrangement and in terms of the voltage applied to the switches with time during the methodology.

When the process according to examples is not being performed, switches M1, M2, M3 are all open to stop extra leakage currents. At the start of the procedure at step 1 at time T1, the voltage to switches M1 and M2 are switched on so the switches are closed. For step 2, at time T2, switch M3 is closed. After the process, at time T3, all switches are commanded off by taking $V_{C1}$, $V_{C2}$ and $V_{C3}$ low.

In the claims the term "ensuring" a switch is closed should be interpreted as closing the switch if open or leaving it closed if already closed.

Example 2

FIG. 4 shows an alternative of the invention where the circuitry 11 has been amended to use PMOS transistors instead of NMOS. Essentially, the change of the circuitry 11 of FIG. 4 compared to that of FIG. 2 is that the serial arrangement of the resistor R3, switch M2 and resistor R4 is connected from the chassis to the positive terminal 6 (rather than the negative), and also the serial arrangement of the resistor R5 and the switch M3, is also connected from the chassis to the positive terminal 6 (rather than the negative). Here the switches M1, M2 and M3 are PMOS switches. With PMOS switches, the controls applied i.e. $V_{C1}$, $V_{C2}$, $V_{C3}$ have to be positive for the switches to be in an off (i.e. open) position.

FIG. 5 shows the timeline of switching of the PMOS switches M1, M2, M3 via control $V_{C1}$ $V_{C2}$ $V_{C3}$ in the methodology. The methodology is similar to the steps above. The calculation is slightly different. Generally, in the steps are:

a first switch M1 and a first pair of serially arranged resistors connected between said terminals with the first switch connected between said first pair of serially arranged resistors, the first pair comprising a first resistor and a second resistor, the first resistor having one terminal thereof electrically connected to said positive terminal or said negative terminal, and the other terminal thereof connected to one terminal of said first switch, and where said second resistor has one terminal connected to the other terminal of said first switch, wherein the other terminal of the second resistor is connected to said negative terminal when said one terminal of said first resistor is electrically connected to said positive terminal or is connected to said positive terminal when said one terminal of said first resistor is electrically connected to said negative terminal, and wherein a voltage $V_y$ is at a point between said first and second resistors;

a second switch M2 and a second pair of serially arranged resistors connected between a chassis of the vehicle/nominal ground and said negative terminal or said positive terminal, with the second switch connected between said second pair of serially arranged resistors, the second pair comprising a third resistor having one terminal electrically connected to said vehicle chassis/nominal ground, and the other terminal connected to one terminal of said second switch, and a fourth resistor having one terminal connected to the other terminal of said second switch, wherein the other terminal of the fourth resistor is connected to said negative terminal when said one terminal of said first resistor is electrically connected to said positive terminal or is connected to said positive terminal when said one terminal of said first resistor is electrically connected to said negative terminal; and wherein a voltage $V_x$ is at a point between said third and fourth resistors;

a third switch M3, and a further fifth resistor connected, via the third switch, between said vehicle chassis/nominal ground and said negative terminal when said one terminal of said first resistor is electrically connected to said positive terminal or is connected to said positive terminal when said one terminal of said first resistor is electrically connected to said negative terminal; and a control block configured to selectively control said switches; and configured to process the values of $V_y$ and $V_x$ to determine the said values of leakage resistance(s).

2. An apparatus as claimed in claim 1, wherein said one terminal of said first resistor is electrically connected to said positive terminal and the control block is configured to perform the following process steps:
 a) ensure switch M1 is closed, and measure $V_y$;
 b) ensure switch M2 is closed and measure the value of Vx during this step=$V_{x1}$;
 c) compute $HVDCM_1 = -V_{x1} \cdot (R_3+R_4)/R_4$;
 d) compute $HVDCP_1 = V_y \cdot (1+R_1/R_2) + HVDCM_1$;
 e) ensure switch M3 is closed and measure the value of Vx during this step=$V_{x2}$;
 f) compute $HVDCM_2 = -V_{x2} \cdot (R_3+R_4)/R_4$;
 g) compute $HVDCP_2 = V_y \cdot (1+R_1/R_2) + HVDCM_2$;
 h) compute the values of $R^+_{leak}$ and/or $R^-_{leak}$ from one or both of the following equations:

$$R^-_{leak} = \beta \cdot R_5 \cdot (\alpha-1)$$

$$R^+_{leak} = 1/\{1/[R_5 \cdot (\alpha-1)] - 1/(R_3+R_4)\}$$

where, $$\alpha = HVDCM_1 \cdot HVDCP_2 / (HVDCM_2 \cdot HVDCP_1) \text{ and}$$
$$\beta = HVDCP_1/HVDCM_1$$

and $R_1$ $R_2$ $R_3$ $R_4$ $R_5$ are the resistance values of first second third fourth and fifth resistors respectively.

3. An apparatus as claimed in claim 2 configured such that during steps a) and/or b), switch M3 is open.

4. An apparatus as claimed in claim 1, wherein said one terminal of said first resistor is electrically connected to said negative terminal and the control block is configured to perform the following process steps:
 a) ensure switch M1 is closed, and measure $V_y$;
 b) ensure switch M2 is closed and measure the value of Vx during this step=$V_{x1}$;
 c) compute $HVDCP_1 = V_{x1} \cdot (R_3+R_4)/R_4$;
 d) compute $HVDCM_1 = -V_y \cdot (1+R_1/R_2) + HVDCP_1$;
 e) ensure switch M3 is closed and measure the value of Vx during this step=$V_{x2}$;
 f) compute $HVDCP_2 = V_{x2} \cdot (R_3+R_4)/R_4$;
 g) compute $HVDCM_2 = -V_y \cdot (1+R_1/R_2) + HVDCP_2$;
 h) compute the values of $R^+_{leak}$ and/or $R^-_{leak}$ from one or both of the following equations:

$$R^-_{leak} = \beta \cdot R_5 \cdot (\alpha-1)$$

$$R^+_{leak} = 1/\{1/[R_5 \cdot (\alpha-1)] - 1/(R_3+R_4)\}$$

where, $$\alpha = HVDCP_1 \cdot HVDCM_2 / (HVDCP_2 \cdot HVDCM_2)$$

and, $$\beta = HVDCM_1/HVDCP_1$$

and $R_1$ $R_2$ $R_3$ $R_4$ $R_5$ are the resistance values of first second third fourth and fifth resistors respectively.

5. An apparatus as claimed in claim 4 configured such that during steps a) and/or b), switch M3 is open.

6. A method of determining the leakage resistance from the positive and/or negative terminals (($R^+_{leak}$, $R^-_{leak}$) of a vehicle battery or battery pack using the apparatus of claim 1, wherein said one terminal of said first resistor is electrically connected to said positive terminal, the method comprising steps of:
 a) ensuring switch M1 is closed, and measure $V_y$;
 b) ensuring switch M2 is closed and measure the value of Vx during this step=$V_{x1}$;
 c) computing $HVDCM_1 = -V_{x1} \cdot (R_3+R_4)/R_4$
 d) computing $HVDCP_1 = V_y \cdot (1+R_1/R_2) + HVDCM_1$
 e) ensuring switch M3 is closed and measure the value of Vx during this step=, $V_{x2}$
 f) computing $HVDCM_2 = -V_{x2} \cdot (R_3+R_4)/R_4$
 g) computing $HVDCP_2 = V_y \cdot (1+R_1/R_2) + HVDCM_2$
 h) computing the values of $R^+_{leak}$ and/or $R^-_{leak}$ from one or both of the following equations:

$$R^-_{leak} = \beta \cdot R_5 \cdot (\alpha-1)$$

$$R^+_{leak} = 1/\{1/[R_5 \cdot (\alpha-1)] - 1/(R_3+R_4)\}$$

where, $$\alpha = HVDCM_1 \cdot HVDCP_2 / (HVDCM_2 \cdot HVDCP_1) \text{ and}$$
$$\beta = HVDCP_1/HVDCM_1.$$

7. A method as claimed in claim 6 wherein during steps a) and b) switch M3 is open.

8. A method as claimed on claim 7 wherein during steps e)) switches M1 and M2 are closed.

9. A method as claimed in claim 8 including the step after step e) of opening all switches.

10. A method of determining the leakage resistance from the positive and/or negative terminals (($R^+_{leak}$, $R^-_{leak}$) of a vehicle battery or battery pack using the apparatus of claim 1, wherein said one terminal of said first resistor is electrically connected to said negative terminal, the method comprising steps:
 a) ensuring switch M1 is closed, and measure $V_y$;
 b) ensuring switch M2 is closed and measuring the value of Vx during this step=$V_{x1}$;
 c) computing $HVDCP_1 = V_{x1} \cdot (R_3+R_4)/R_4$,
 d) computing $HVDCM_1 = -V_y \cdot (1+R_1/R_2) + HVDCP_1$
 e) ensuring switch M3 is closed and measure the value of Vx during this step=$V_{x2}$
 f) computing $HVDCP_2 = V_{x2} \cdot (R_3+R_4)/R_4$,
 g) computing $HVDCM_2 = -V_y \cdot (1+R_1/R_2) + HVDCP_2$
 h) computing the values of $R^+_{leak}$ and/or $R^-_{leak}$ from one or both of the following equations:

$$R^-_{leak} = \beta \cdot R_5 \cdot (\alpha-1)$$

$$R^+_{leak} = 1/\{1/[R_5 \cdot (\alpha-1)] - 1/(R_3+R_4)\}$$

where, $$\alpha = HVDCP_1 \cdot HVDCM_2/(HVDCP_2 \cdot HVDCM_1)$$

and, $$\beta = HVDCM_1/HVDCP_1$$

and $R_1$ $R_2$ $R_3$ $R_4$ $R_5$ are the resistance values of first second third fourth and fifth resistors respectively.

11. A method as claimed in claim 10 wherein during steps a) and b) switch M3 is open.

12. A method as claimed on claim 11 wherein during steps e)) switches M1 and M2 are closed.

13. A method as claimed in claim 12 including the step after step e) of opening all switches.

14. An apparatus as claimed in claim 1, wherein the first switch M1 and the first pair of serially arranged resistors are arranged in parallel with the second switch M2 and the second pair of serially arranged resistors.

15. An apparatus as claimed in claim 14, wherein the third switch and the fifth resistor are arranged in parallel to both of 1) the first switch M1 and the first pair of serially arranged resistors and 2) the second switch M2 and the second pair of serially arranged resistors.

16. An apparatus configured to determine the leakage resistance in respect of a positive terminal and/or a negative terminal of a vehicle battery or battery pack; said apparatus comprising circuitry comprising: a first switch M1 and a first pair of serially arranged resistors connected between said terminals with the first switch connected between said first pair of serially arranged resistors, wherein a voltage Vy is at a point between said first pair of serially arranged resistors; a second switch M2 and a second pair of serially arranged resistors connected between a chassis of the vehicle/nominal ground and said negative terminal or said positive terminal, with the second switch connected between said second pair of serially arranged resistors, wherein a voltage Vx is at a point between said second pair of serially arranged resistor; a third switch M3, and a further fifth resistor connected, via the third switch, between said vehicle chassis/nominal ground, and either the negative terminal or the positive terminal; and a control block configured to selectively control said switches; and configured to process the values of Vy and Vx to determine the said values of leakage resistance(s).

17. An apparatus as claimed in claim 16 wherein said one terminal of said first resistor is electrically connected to said positive terminal and the control block is configured to perform the following process steps:
 a) ensure switch M1 is closed, and measure $V_y$;
 b) ensure switch M2 is closed and measure the value of Vx during this step=$V_{x1}$;
 c) compute $HVDCM_1 = -V_{x1} \cdot (R_3+R_4)/R_4$;
 d) compute $HVDCP_1 = V_y \cdot (1+R_1/R_2) + HVDCM_1$;
 e) ensure switch M3 is closed and measure the value of Vx during this step=$V_{x2}$;
 f) compute $HVDCM_2 = -V_{x2} \cdot (R_3+R_4)/R_4$;
 g) compute $HVDCP_2 = V_y \cdot (1+R_1/R_2) + HVDCM_2$;
 h) compute the values of $R^+_{leak}$ and/or $R^-_{leak}$ from one or both of the following equations:

$$R^-_{leak} = \beta \cdot R_5 \cdot (\alpha-1)$$

$$R^+_{leak} = 1/\{1/[R_5 \cdot (\alpha-1)] - 1/(R_3+R_4)\}$$

where, $$\alpha = HVDCM_1 \cdot HVDCP_2/(HVDCM_2 \cdot HVDCP_1) \text{ and}$$
$$\beta = HVDCP_1/HVDCM_1$$

and $R_1$ $R_2$ $R_3$ $R_4$ $R_5$ are the resistance values of first second third fourth and fifth resistors respectively.

18. An apparatus as claimed in claim 17 configured such that during steps a) and/or b), switch M3 is open.

19. An apparatus as claimed in claim 16, wherein said one terminal of said first resistor is electrically connected to said negative terminal and the control block is configured to perform the following process steps:
 a) ensure switch M1 is closed, and measure $V_y$;
 b) ensure switch M2 is closed and measure the value of Vx during this step=$V_{x1}$;
 c) compute $HVDCP_1 = V_{x1} \cdot (R_3+R_4)/R_4$;
 d) compute $HVDCM_1 = -V_y \cdot (1+R_1/R_2) + HVDCP_1$;
 e) ensure switch M3 is closed and measure the value of Vx during this step=$V_{x2}$;
 f) compute $HVDCP_2 = V_{x2} \cdot (R_3+R_4)/R_4$;
 g) compute $HVDCM_2 = -V_y \cdot (1+R_1/R_2) + HVDCP_2$;
 h) compute the values of $R^+_{leak}$ and/or $R^-_{leak}$ from one or both of the following equations:

$$R^-_{leak} = \beta \cdot R_5 \cdot (\alpha-1)$$

$$R^+_{leak} = 1/\{1/[R_5 \cdot (\alpha-1)] - 1/(R_3+R_4)\}$$

where, $$\alpha = HVDCP_1 \cdot HVDCM_2/(HVDCP_2 \cdot HVDCM_1)$$

and, $$\beta = HVDCM_1/HVDCP_1$$

and $R_1$ $R_2$ $R_3$ $R_4$ $R_5$ are the resistance values of first second third fourth and fifth resistors respectively.

20. An apparatus as claimed in claim 16, wherein the first switch M1 and the first pair of serially arranged resistors are arranged in parallel with the second switch M2 and the second pair of serially arranged resistors.

* * * * *

UNITED STATES PATENT AND TRADEMARK OFFICE
CERTIFICATE OF CORRECTION

PATENT NO. : 11,264,651 B2
APPLICATION NO. : 16/804604
DATED : March 1, 2022
INVENTOR(S) : Seyed R Zarabadi and Mark W Gose It is certified that error appears in the above-identified patent and that said Letters Patent is hereby corrected as shown below:

In the Claims

Column 8, Line 30, in Claim 4, "$(HVDCP_2 \cdot HVDCM_2)$" should read --$(HVDCP_2 \cdot HVDCM_1)$--.

Column 8, Line 40, in Claim 6, "$((R^+_{leak},$" should read --$(R^+_{leak},$--.

Column 8, Line 51, in Claim 6, ", $V_{x2}$" should read --$V_{x2}$;--.

Column 8, Line 66, in Claim 8, "claimed on" should read --claimed in--.

Column 8, Line 67, in Claim 8, "e))" should read --e)--.

Column 9, Line 4, in Claim 10, "$((R^+_{leak},$" should read --$(R^+_{leak},$--.

Column 9, Line 35, in Claim 12, "claimed on" should read --claimed in--.

Column 9, Line 36, in Claim 12, "e))" should read --e)--.

Column 9, Line 54, in Claim 16, "Vy" should read --$V_y$--.

Column 9, Line 60, in Claim 16, "Vx" should read --$V_x$--.

Column 10, Line 3, in Claim 16, "Vy and Vx" should read --$V_y$ and $V_x$--.

Column 10, Line 5, in Claim 17, "claim 16" should read --claim 16,--.

Signed and Sealed this
Twelfth Day of July, 2022

Katherine Kelly Vidal
*Director of the United States Patent and Trademark Office*